United States Patent [19]

Tsui et al.

[11] Patent Number: 4,644,267
[45] Date of Patent: Feb. 17, 1987

[54] SIGNAL ANALYSIS RECEIVER WITH ACOUSTO-OPTIC DELAY LINES

[75] Inventors: James B. Y. Tsui, Centerville; Robert L. Davis, Englewood, both of Ohio

[73] Assignee: The United States of America as represented by the Secretary of the Air Force, Washington, D.C.

[21] Appl. No.: 742,825

[22] Filed: Jun. 10, 1985

[51] Int. Cl.[4] .............................................. G01R 23/16
[52] U.S. Cl. .................................. 324/77 K; 350/356; 350/358; 332/7.51
[58] Field of Search ...................... 324/72, 72.5, 83 R, 324/79 R, 77 K; 350/350 R, 356, 162.13, 354, 358; 332/7.51; 343/17.7

[56] References Cited

U.S. PATENT DOCUMENTS

| | | | |
|---|---|---|---|
| 3,943,464 | 3/1976 | Brienza et al. | 332/7.51 |
| 3,962,657 | 6/1976 | Redman | 332/7.51 |
| 4,326,778 | 4/1982 | Berg et al. | 350/358 |
| 4,390,247 | 6/1983 | Freyre | 350/358 |
| 4,421,388 | 12/1983 | Berg et al. | 350/358 |
| 4,443,066 | 4/1984 | Freyre | 350/358 |
| 4,468,084 | 8/1984 | Lynn | 350/356 |

Primary Examiner—Michael J. Tokar
Attorney, Agent, or Firm—Bernard E. Franz; Donald J. Singer

[57] ABSTRACT

The system makes use of an interferometric Bragg cell for the time delays needed by the multiple antenna inputs in an angle-of-arrival (AOA) measurement system, for accurate measurements over wide bandwidths. A signal Bragg cell is modulated with a selected band of the EW signal environment, using a separate transducer coupled to each quadrant antenna element. A reference Bragg cell is modulated with a chirp signal. Coherent light from a laser is split and directed to both the signal cell and the reference cell. The output light beams from the reference Bragg cell and signal Bragg cell are combined and focused onto photo detectors having a one-dimensional array for each quadrant antenna element. The reference and signals are heterodyned at the photo detectors, which results in a channelized spectral output with each channel at the same intermediate frequency (IF). The outputs of the photodetectors are used by a phase comparison unit, cued by a frequency measurement receiver to the correct detectors, to provide the AOA measurement.

1 Claim, 4 Drawing Figures

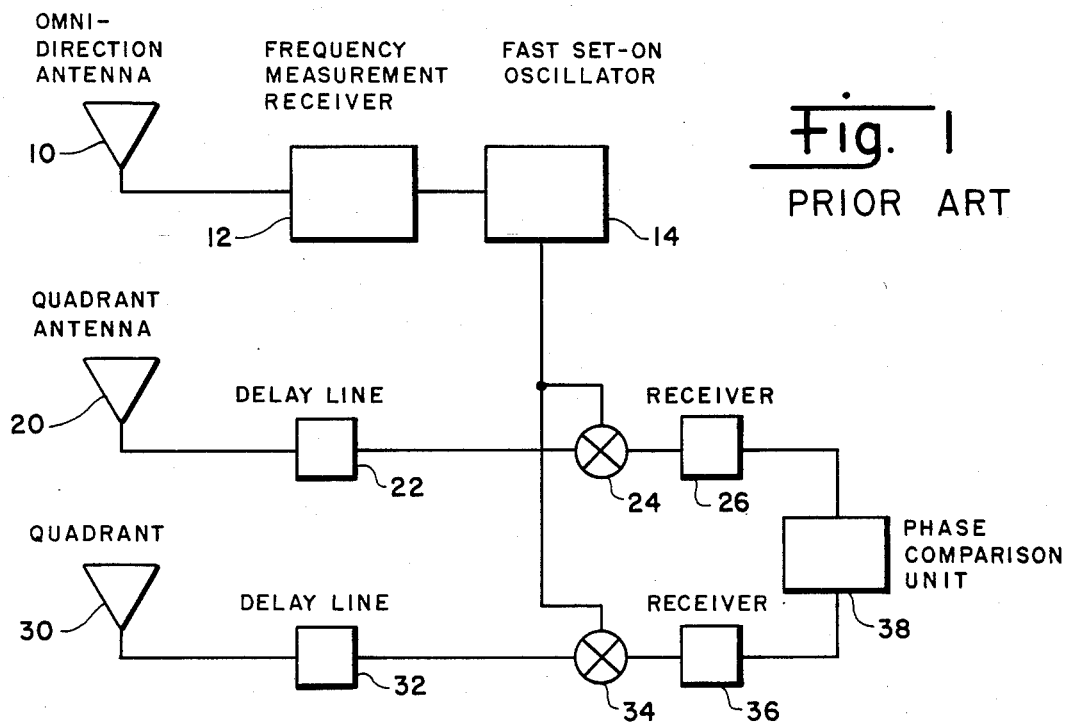
Fig. 1 PRIOR ART
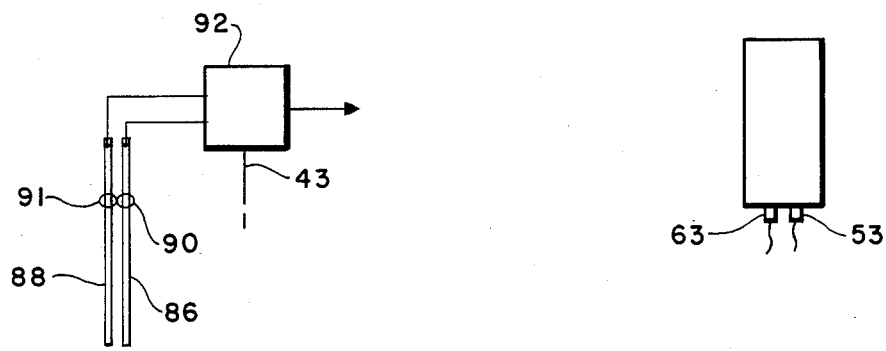
Fig. 4
Fig. 3

SIGNAL ANALYSIS RECEIVER WITH ACOUSTO-OPTIC DELAY LINES

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of receivers which use acousto-optic delay lines to analyze signals such as radar pulses present in the electronic warfare (EW) environment: and more particularly to EW receivers which includes angle-of-arrival and instantaneous frequency measurement capability.

An interferometric Bragg cell used with a laser has been previously investigated and demonstrated as a spectral analysis device by the Avionics Laboratory of the U.S. Air Force for EW applications. The interferometric Bragg cell consists of a reference Bragg cell and a signal Bragg cell. The reference Bragg cell is modulated with a chirp signal. A selected band of the EW signal environment modulates the signal Bragg cell. The output of the reference Bragg cell and signal Bragg cell are combined and result in a channelized spectral output with each channel at the same intermediate frequency (IF).

A conventional phase comparison angle-of-arrival (AOA) system to cover a wide frequency range (FIG. 1) mixes signals from quadrant antennas via delay lines with a local oscillator signal which is controlled by a frequency measurement receiver having an omni-directional antenna.

Berg et al U.S. Pat. No. 4,326,778 discloses an acousto-optic time integrating correlator which uses a Bragg angle delay device and acts to determine the time difference of arrival of electrical signals. It is useful in extracting weak radar return signals from a noisy environment. The correlation of linear FM chirp signals is illustrated in FIG. 3 of the patent. Berg et al U.S. Pat. No. 4,421,388 shows a similar frequency scanning correlator using a Bragg angle delay line. Bragg angle delay lines are also disclosed in Brienza et al U.S. Pat. No. 3,943,464 and Freyre U.S. Pat. No. 4,390,247. Freyre U.S. Pat. No. 4,443,066 discloses a dual Bragg cell system for translating or shifting the position of a coherent beam of light.

SUMMARY OF THE INVENTION

An object of the invention is to provide a receiver which permits accurate angle-of-arrival measurements over wider frequency bandwidths.

According to the invention, the receiver makes use of an interferometric Bragg cell for the delays needed by the multiple antenna inputs in an angle-of-arrival measurement system.

BRIEF DESCRIPTION OF THE DRAWING

FIG. 1 is a block diagram of a conventional AOA system to cover a wide frequency range;

FIG. 3 is a view along lines 3—3 of FIG. 2 of the signal Bragg cell showing the input transducers; and FIG. 4 is a view along lines 4—4 of FIG. 2 of the detector arrays having outputs to a phase comparison unit.

DETAILED DESCRIPTION

Figure 2:
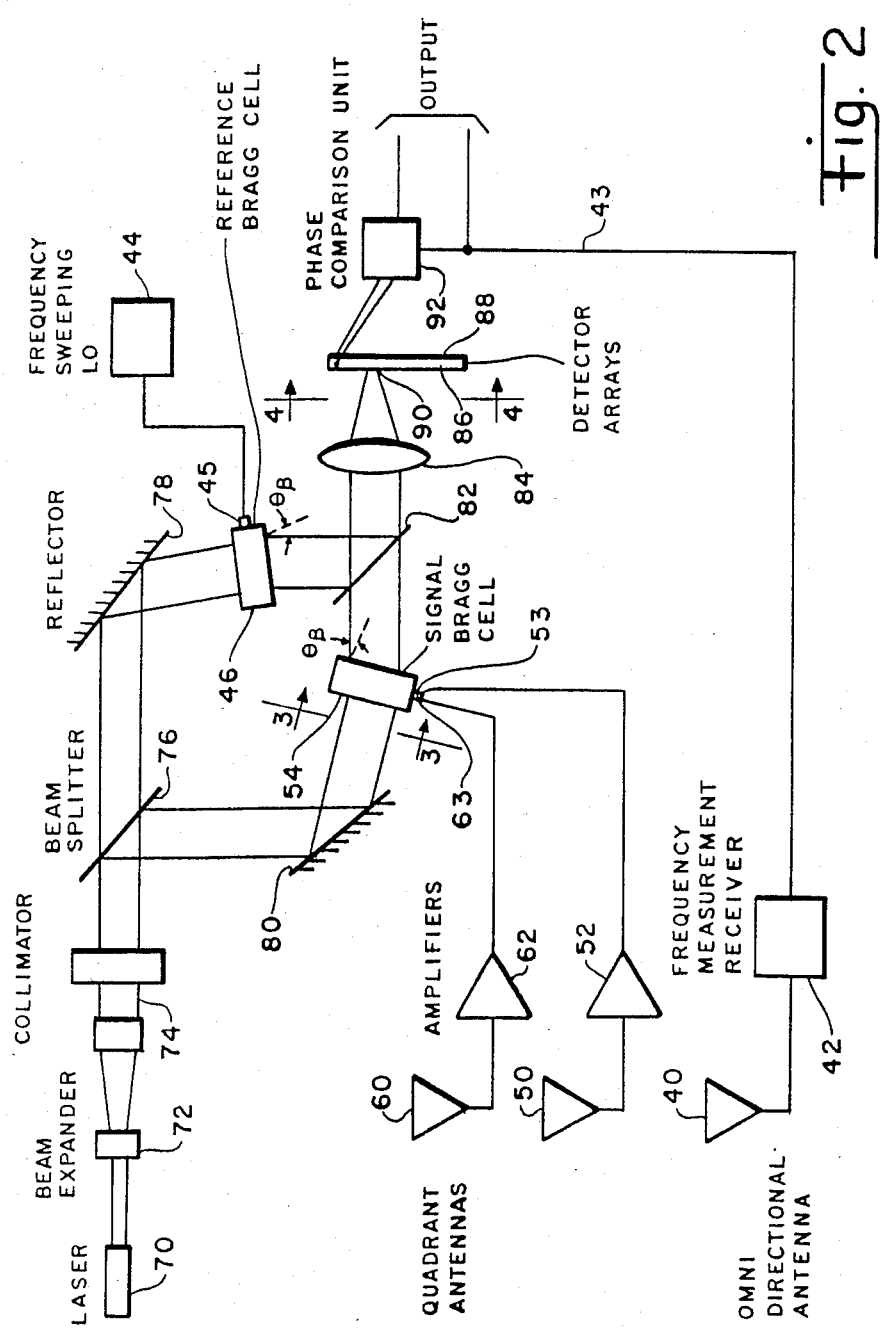
FIG. 2 is a block diagram of a receiver system with an interferometric Bragg cell arrangement to measure AOA over a wide frequency range.

Electronic warfare systems are required to measure angle-of-arrival of threat emitters over a wide frequency bandwidth and on a pulse by pulse basis in the presence of simultaneous signals. In order to obtain accurate AOA, phase interferometric systems must be used. One approach to achieve this requirement is shown in FIG. 1. An omni directional antenna 10 is coupled to a frequency measurement receiver 12, and quadrant antennas 20 and 30 are coupled via delay lines 22 and 32 and mixers 24 and 34 to narrow band receivers 26 and 36. The outputs of the receiver 26 and 36 are coupled to a phase comparison unit 38. A signal received via the omni-directional antenna 10 at the receiver 12 is used to determine the frequency of the input signal and tune a fast set-on local oscillator 14 for the mixers 24 and 34 of narrow band receivers 26 and 36 to the correct frequency before signal arrival from the delay lines 22 and 32. Then the narrow band receivers 26 and 36 will pass the desired signals to the unit 38 to measure the phase difference of the input signal and generate AOA information. A major problem in this approach is that the delay lines must be phase matched and operate over a wide frequency range. Current delay line devices employing surface acoustic wave (SAW) or fiber optic technologies are difficult to track in phase over wide frequency ranges which limits AOA measurement accuracy.

It has been demonstrated that signals can be tracked in phase for a Bragg cell with multiple input transducers. There is a delay between the signal input to a Bragg cell and its appearance as a modulation of a laser source on the output of the Bragg cell. In the prior Bragg cell receivers, the phase information is lost upon detection, which prevents its use in the phase AOA measurement system. However, in an optical interferometric Bragg cell approach, the phase can be retained.

FIG. 2 illustrates the employment of an interferometric Bragg cell as a delay device in a simple system having two quadrature antenna elements for AOA phase measurement. The system is shown with an omni directional antenna 40, and two quadrant antenna elements 50 and 60. The omni antenna 40 is coupled to an instantaneous frequency measurement receiver 42, which measures the signal frequency and forwards information on the signal frequency to a phase comparison unit 92. The quadrant antenna elements 50 and 60 are coupled via respective amplifiers 52 and 62 to a signal Bragg Cell 54. A frequency sweeping local oscillator 44 is coupled to a reference Bragg cell 46.

The RF signals from the amplifiers 52 and 62 are coupled to the signal cell 54 via two transducers 53 and 63, shown in FIG. 3 as being side by side.

As shown in FIGS. 2 and 4, there are two photodetector arrays 86 and 88, which are linear arrays placed side by side, with only array 86 being visible in FIG. 2. The detectors must be closely spaced. One way (not shown) to achieve the proper spacing at the focal plane is to use light guides, each having one end in the focal plane and the other end coupled to a detector element. The ends in the focal plane may then be arranged in two columns, with the desired spacing between the columns and also between the guides in each column.

Coherent light from a laser 70 passes through a beam expander 72, and a collimator 74 to a beam splitter 76. The reflected beam from the beam splitter 76 via a reflector 80 is directed to the signal Bragg cell 54; while the transmitted beam from the beam splitter via a reflector 78 is directed to the reference Bragg cell 46. The aforementioned two beams are diffracted in their respective Bragg cells and are directed to opposite sides of a beam splitter 82. The reflected beam from the reference cell 46, and the transmitted beam from the signal cell 84, together pass through a Fourier Transform lens 54 and are focused on photo-detector arrays 86 and 88. Outputs from the detector arrays are coupled to the phase comparison unit 92.

The two Bragg cells 46 and 54 are bulk wave devices, which may for example be lithium niobate piezo-electric crystals. RF signals from the amplifiers are coupled to the cell 54 via respective transducers 53 and 63, to launch acoustic waves. The transducers are side by side. The two acoustic waves pass through the cell to an absorber (now shown) at the opposite end. In like manner, the chirp signal from the oscillator 44 is coupled via a transducer 45. The signal cell also functions as an acoustic delay line for the signals. Since the two signals in the signal cell 54 pass through the same medium, they will track in phase with high accuracy.

Acousto-optical diffraction employs a high interaction efficiency Bragg technique where the diffraction angle varies with the RF frequency, as described in Freyre U.S. Pat. No. 4,390,247. The acoustic waves cause periodic variations in the refractive index in each cell which interact with the incident light beam. Acoustic frequency components of the propagating waves correspond to the signal frequency components and cause the cells to diffract the beams of incident coherent light and to frequency shift the diffracted beams. The relative phases of the acoustic frequency components of the acoustic waves also correspond to the phases of the frequency components of the delayed signal and are imparted to the diffracted light beams.

Since the single light beam entering cell 54 interacts with two acoustic waves, the emerging beam will have two components. The two acoustic waves have the same frequency but differ in phase, so the two components of the emerging beam will be at the same angle, but retain the separate phase information.

A Fourier Transform element such as a spherical mirror or lens 84 focuses light from cell 54 transmitted through the beam splitter 82 onto the detector array 86, 88 which acts a mixer. At the same time, the beam splitter 82 reflects a reference beam from cell 46 onto the detector array. The beam from cell 54 has two components side by side which fall separately on the arrays 86 and 88. The combined beams from the two cells 46 and 54 pass through the lens 84 and are focused on the photodetectors 86 and 88, the focal areas being shown in FIG. 4 as spots 90 and 91. As a result heterodyning takes place and the output frequency of the detectors is proportional to the difference frequency between the components of the signal beam and the reference beam. The light is focused as two separate spots on the arrays 86 and 88 as shown in FIG. 4. Note that since the angle of diffraction depends on the frequency, the location at which the beam focuses along the detector arrays also depends on the frequency. The chirp signal in the reference cell 46 will cause the reference signal at the arrays to sweep the length thereof during each cycle of the chirp. The frequency difference between the reference and signal will be a fixed IF at the pair of detectors at which the signals are focused.

Thus the outputs of the detector arrays are electrical signals at an intermediate frequency (IF). The output of array 86 includes the phase information of the RF signal from amplifier 52, while the output of array 86 includes the phase information of the RF signal from amplifier 62. By comparing the phase of the two outputs from the detector arrays 86 and 88, the angle-of-arrival can be accurately measured. The delay time in the Bragg cell 54 is the time required by the cueing receiver 42 to set the phase comparison system of unit 92 to the correct pair of detectors of the arrays 86 and 88. One advantage of this system is that the outputs from the detectors have the same IF. Therefore, the phase comparison system can operate at a fixed IF. Another advantage is that the two signals from the two quadrant antennas 50 and 60 are in the same Bragg cell 54; therefore, the phase tracking between the two signals is easier to maintain.

The phase information from unit 92 and the frequency information from the receiver 42 are supplied to a utilization unit (not shown), which may include a printout and display.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

What is claimed is:

1. An apparatus for measuring the angle of arrival of a signal in a system having at least two quadrant antenna elements which receive the signal with a phase difference which is a function of the angle of arrival, and a frequency measurement receiver with antenna means for cueing the frequency of the signal to a phase comparison unit, comprising;

a signal cell which is an acousto-optical device having two transducers at one end coupled respectively to said two quadrant antenna elements for launching two parallel acoustic waves in said signal cell in response to a received signal;

a reference cell which is an acousto-optical device having a transducer at one end, a frequency sweeping local oscillator producing a reference signal coupled to said transducer of the reference cell for launching an acoustic wave in said reference cell;

a source of coherent light, means for splitting light from said source into two beams and directing them respectively into the signal cell and the reference cell, diffracted light beams being provided in response to interaction of the light beams with the acoustic waves, the diffracted light beams being modulated in accordance with the frequency and phase of the respective signals, the diffracted light from the signal cell having two components modulated with the same frequency and different phases of the received signal at the quadrant antenna elements, the diffracted light from the reference cell being modulated with the frequency sweeping of the reference signal;

photo detector means having two adjacent one-dimensional arrays of detector elements, each array having an output line coupled to said phase comparison unit;

means for combining the light beams from the signal cell and the reference cell and focusing them onto said photo detector means, the two components from the signal cell being heterodyned respectively in the two arrays with the beam from the reference cell to produce IF signals in a pair of detector elements, one in each array, for use in measuring the phase difference in the phase comparison unit to determine the angle of arrival of said signal.

* * * * *